United States Patent [19]

Hasegawa et al.

[11] Patent Number: 5,105,237
[45] Date of Patent: Apr. 14, 1992

[54] SEMICONDUCTOR LIGHT-EMITTING DEVICE WITH PARTIAL ENCAPSULATION

[75] Inventors: Kazuyoshi Hasegawa; Masayuki Kubota; Mitsuo Ishii; Seiichi Nagai, all of Itami, Japan

[73] Assignee: Mitsubishi Denki Kabushiki Kaisha, Japan

[21] Appl. No.: 724,460

[22] Filed: Jul. 3, 1991

Related U.S. Application Data

[63] Continuation of Ser. No. 630,848, Dec. 20, 1990, abandoned.

[30] Foreign Application Priority Data

Jul. 16, 1990 [JP] Japan ................... 2-189917

[51] Int. Cl.⁵ .................................. H01L 33/00
[52] U.S. Cl. .................................. 357/17; 357/72; 357/19; 372/43; 372/50
[58] Field of Search ............... 357/72, 17, 19; 372/43, 372/44, 45, 46, 47, 48, 49, 50

[56] References Cited

U.S. PATENT DOCUMENTS

| 4,411,500 | 10/1983 | Yonezawa et al. | 357/43 X |
| 4,432,131 | 2/1984 | Sadamasa et al. | 357/72 X |
| 4,478,588 | 10/1984 | Lockard | 357/72 X |

FOREIGN PATENT DOCUMENTS

| 0039017 | 11/1981 | European Pat. Off. |
| 0114258 | 8/1984 | European Pat. Off. |
| 0226431 | 8/1985 | Fed. Rep. of Germany |
| 3929125 | 3/1990 | Fed. Rep. of Germany |
| 53-33436 | 9/1978 | Japan |
| 63-5579 | 1/1988 | Japan |
| 63-14489 | 1/1988 | Japan |
| 63-33877 | 2/1988 | Japan |
| 2046472 | 11/1980 | United Kingdom |

OTHER PUBLICATIONS

Siner et al., "Shaped Pellets Aid Epoxy Bonding", *Article Reprints on Epoxy Packaging*, Waldman & Sons, New Jersey, U.S.A., 1964, pp. 6–7.
Chester, "Fiber-optic Connections Highlights Agenda at ECC", Electron Design, vol. 30, No. 10, May 1982, pp. 35–36.
Wilson, "Fibre Optic Communications", Electronics & Wireless World, No. 1581, Jun. 1984, pp. 27–30.
Speer et al., "Planar Double-Heterostructure GaAlAs LED's Packaged for Fiber Optics", IEEE Transactions on Components, Hybrids, and Manufacturing Technology, vol. CHMT-3, No. 4, Dec. 1980, pp. 480–484.

*Primary Examiner*—William Mintel
*Attorney, Agent, or Firm*—Leydig, Voit & Mayer

[57] ABSTRACT

A semiconductor light-emitting device which provides optically undistorted light includes a semiconductor light-emitting element and at least one optical element. The light emitting-element and the optical element are held in a resin which is transparent to light emitted from the light-emitting element so that light emitted from the light-emitting element travels to the optical element along an optical path entirely within the resin, but the light exits a portion of the optical element located outside of the resin.

7 Claims, 2 Drawing Sheets

SEMICONDUCTOR LIGHT-EMITTING DEVICE WITH PARTIAL ENCAPSULATION

This application is a continuation of application U.S. Ser. No. 07/630,848, filed Dec. 20, 1990, now abandoned.

This invention relates to a structure of a semiconductor light-emitting device which can be used in a light pickup of an optical disc apparatus, as a module in an optical communications system, or the like.

BACKGROUND OF THE INVENTION

Generally, a conventional semiconductor light-emitting device comprises a semiconductor light-emitting element mounted on a heat sink block which, in turn, is mounted on a stem. The semiconductor light-emitting element, the heat sink block and the stem are covered by a hollow envelope joined to the stem. Light goes out through a glass window provided in the hollow envelope. With this structure, the light-emitting element can be operated in a hermetically sealed, stable environment.

For stability against the environment, easy production, and reduced manufacturing cost of such semiconductor light-emitting devices, resin-molding is considered to be more advantageous. For example, as shown in FIG. 1, a semiconductor light-emitting element 1 is mounted on a base 4 with an Si submount 2 and a heat sink block 3 interposed therebetween, and the element 1, the submount 2 and the heat sink block 3 are sealed in a transparent resin on the base 4. Light 6 emitted from the semiconductor light-emitting element 1 emerges through the transparent resin 5.

Japanese Published Patent Application No. SHO 63-5579 discloses an optical connector module which comprises a semiconductor light-emitting element enclosed in a resin. The module includes a molded resin having a hollow cavity in which an optical semiconductor element is disposed. A cylindrical member for coupling the module to an optical fiber device protrudes from one surface of the resin. The resin in the vicinity of the semiconductor element has a high light reflectance so that the intensity of light coupled to the optical fiber is improved.

The emitted light 6 from the semiconductor light-emitting element 1 of the semiconductor light-emitting devuce shown in FIG. 1 is usually made to pass through one or more of optical elements, such as a beam splitter, a lens, an optical fiber, a glass plate and the like. The emitted light 6 must have an optically undistorted light intensity distribution so that coupling of light to an optical system is not adversely affected. If the light intensity distribution is distorted, it is difficult to, for example, properly thin a light beam. The emitted light 6 emerges from the device through a surface portion 7 of the transparent resin, and, therefore, the flatness of the surface portion 7 is critical. If the portion 7 does not have an optically desirable surface, the light intensity distribution of the emitted light 6 is distorted and, therefore, undesired optical coupling with a succeeding optical system may result. In order to provide an optically desirable surface for the portion 7, the portion 7 could be finished by, for example, polishing. However, it is difficult to aschieve a flatness of the same degree as optical elements on the surface portion 7, and the yield is poor. Furthermore, since ordinary resins are easily damaged and poor in etch-resistance, the surface of such resins is not suitable for use as a light emerging surface.

The previously mentioned Japanese Published Application No. SHO 63-5579 discloses enclosing a semiconductor light-emitting element with a resin, but it is not intended to overcome the above-discussed problems.

According to the present invention, a semiconductor light-emitting device is provided, in which a semiconductor light-emitting element is sealed in a transparent resin and which can provide a stable light output with an undistorted intensity distribution.

SUMMARY OF THE INVENTION

A semiconductor light-emitting device according to the present invention includes a semiconductor light-emitting element and a first optical element disposed in such a predetermined position that light emitted by the semiconductor light-emitting element travels through said first optical element. The light-emitting element and part of the first optical element are sealed in a transparent resin member comprising a resin which is transparent to the light emitted by the semiconductor light-emitting element, in such a manner that the entire optical path extending between the semiconductor light-emitting element and the light entrance portion of the first optical element is positioned within the resin member. The light exit portion of the first optical element from which the light emitted by the semiconductor light-emitting element exits the device is positioned outside of the resin member.

According to another feature of the present invention, at least one additional optical element is disposed in the optical path between the semiconductor light-emitting element and the light entrance portion of the first optical element.

Since the optical path extending between the semiconductor light-emitting element and the optical element is within the resin, light out-put from the semiconductor light-emitting device does not pass through an interface between the resin and the space surrounding the resin, the intensity distribution of the emitted light is not disturbed and, therefore, undistorted light can be provided from the exit portion of the optical element positioned outside the resin member. The resin member isolates the semiconductor light-emitting element from the external atmosphere and also secures the light-emitting element and the optical element in a predetermined positional relationship.

DETAIL DESCRIPTION OF EMBODIMENTS

The present invention is described in detail by means of some embodiments.

Figure 1:
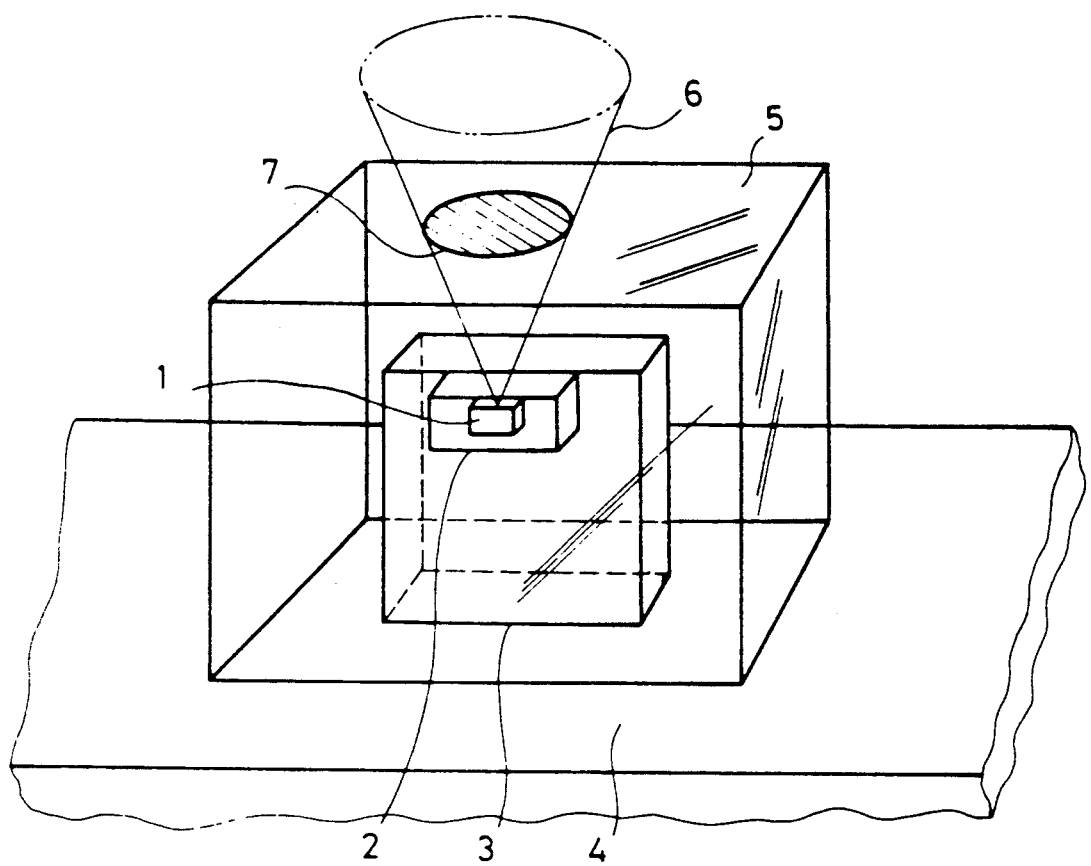
FIG. 1 is a perspective view schematically illustrating the structure of a conventional semiconductor light-emitting device.
Figure 2:
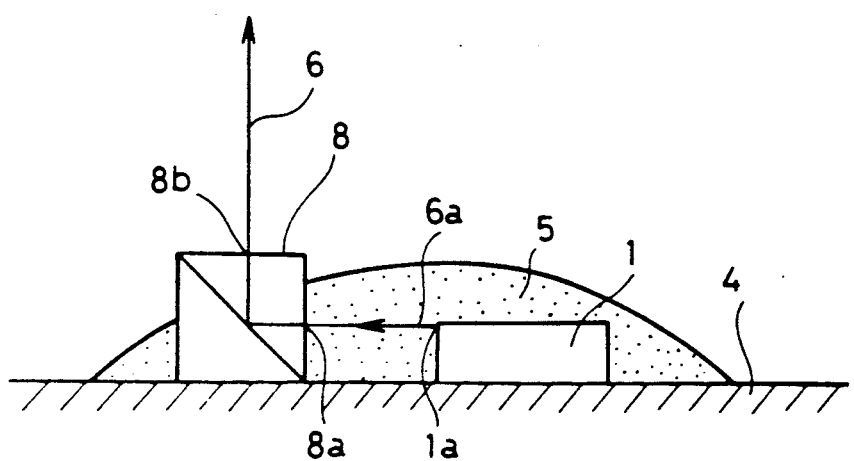
FIG. 2 is a cross-sectional side view schematically illustrating the structure of a semiconductor light-emitting device according to a first embodiment of the present invention.

FIG. 2 illustrates a semiconductor light-emitting device according to a first embodiment of the present invention. The semiconductor light-emitting device comprises a semiconductor light-emitting device element 1 fixedly mounted on a base 4 and emitting light 6 from its light-emitting region 1a, and a beam splitter 8 is also fixed to the base 4. A transparent resin 5 covers the entirety of the light-emitting element 1 on the base 4, and also a substantial portion of the beam splitter 8, including a light incident portion of a surface 8a thereof, while leaving a light exit surface 8b exposed, whereby the entirety of the optical path 6a for light from the semiconductor light-emitting element 1 extending between the element 1 and the beam splitter 8 is located in the resin 5. The resin 5 is transparent to light emitted by the semiconductor light-emitting element 1. A cyclic aliphatic epoxy resin, for example, may be used. Another resin, such as diglycidyl ester, may also be usable. The transparent resin 5 adheres to and fills the space between the light-emitting region 1a of the light-emitting element 1 and the light incident surface 8a of the beam splitter 8, leaving no gap between the resin 5 and the region 1a or between the resin and the light entrance portion of the surface 8a.

The light 6 emitted by the semiconductor light-emitting element 1 passes through the transparent resin 5, enters into the beam splitter 8 where it is deflected 90°, and emerges from the device from the surface 8b of the beam splitter 8. Since the beam splitter 8 has its light-incident surface 8a well-finished so as to give no distortion to the incident light intensity distribution and, furthermore, it is in intimate contact with the resin, the light 6 emitted from the semiconductor light-emitting element 1 can emerge from the device without being distorted.

Figure 3:
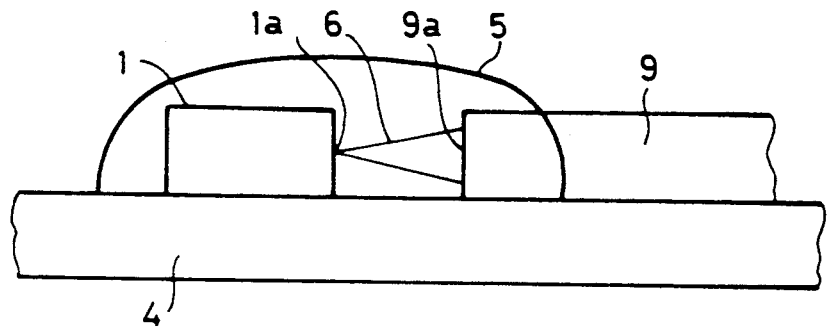
FIG. 3 is a side view schematically illustrating the structure of a semicondutor light-emitting device according to a second embodiment of the present invention.

FIG. 3 shows a second embodiment of the present invention. The semiconductor light-emitting device of FIG. 3 comprises a semiconductor light-emitting element 1 fixedly mounted on a base 4, and an optical fiber 9. The optical fiber 9 has its proximal end fixed to the base 4 with is light-incident end surface 9a being located in a predetermined positional relationship with the light-emitting region 1a of the element 1. A transparent resin 5, which can be the same material as used in the first embodiment, completely covers the semiconductor light-emitting element 1 and the end portion, including the light-incident end surface 9a, of the optical fiber 9. The transparent resin 5 is disposed filling the space between the light-emitting element 1 and the surface 9a of the optical fiber 9 so that the entirety of the portion of the optical path for light 6 emitted from the element 1 which extends from the light emitting region 1a of the element 1 and the light incident surface 9a of the optical fiber 9 is located within the resin 5.

Figure 4:
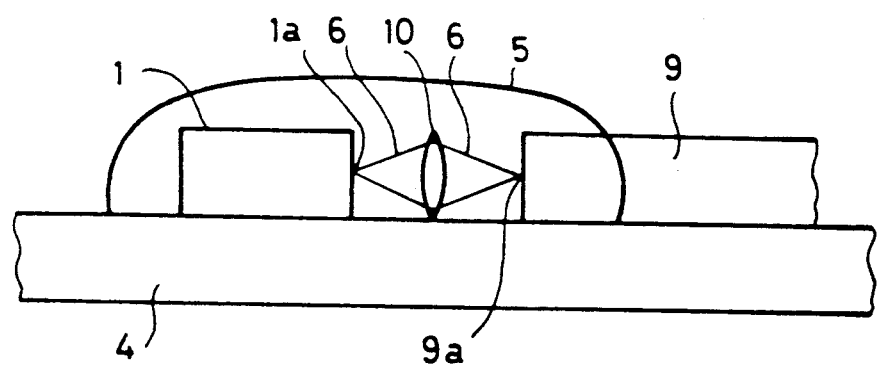
FIG. 4 is a side view schematically illustrating the structure of a semiconductor light-emitting device according to a third embodiment of the present invention.

FIG. 4 shows a third embodiment of the present invention. This embodiment differs from the second one shown in FIG. 3 only in that another optical element, namely, a lens 10 is disposed in the transparent resin 5 between the light-emitting portion 1a of the semiconductor light-emitting element 1 and the light-incident end surface 9a of the optical fiber 9 so that the lens 10 is in the optical path of light emitted from the element 1. Components and functions equivalent to the ones shown in FIG. 3 are given the same reference numerals and further explanation of them is omitted.

In the second embodiment shown in FIG. 3, the light 6 from the semiconductor light-emitting element 1 travels in the transparent resin 5 to enter into the optical fiber 9 through the light entrance end surface 9a and goes out from the other end (not shown) of the optical fiber 9. In the third embodiment shown in FIG. 4, the light 6 passes through the lens 10, in addition, before it reaches the entrance end surface 9a of the optical fiber 9, and exits the device from the other end (not shown) of the optical fiber 9 as in the embodiment of FIG. 3.

In both of the second and third embodiments, too, the light output of the semiconductor light-emitting device goes out not through the surface of the resin, but through the well-finished surface of the optical element, and, therefore, light without distortion is provided from the semiconductor light-emitting device.

Optical elements, for example, glass plates, other than the ones used in the described embodiment may be used. The optical elements usable in the present invention are light transmissive. Types, numbers and arrangements of optical elements in the sealing resin are determined in accordance with the purpose of the light-emitting device.

With the above-described arrangement of the present invention, the surface of sealing resin need not be provided with any special finishing as is provided for optical elements in order to produce an undistorted, stable light output from a semiconductor light-emitting device because light emerges from the device through a well-finished surface of an optical element. Furthermore, because the light-emitting element is sealed in a resin, its stability against the environment is improved, and also, the positional relationship between the light-emitting element and the associated optical element(s) is kept fixed.

What is claimed is:

1. A semiconductor light-emitting device comprising:
   a semiconductor light-emitting element;
   an optical element selcted from the group consisting of a beam splitter, a lens, and a glass plate and having first and second surfaces disposed in a predetermined positional relationship with said light-emitting element such that light emitted from said light-emitting element travels into said optical element through said first surface and out of said optical element through said second surface; and
   a resin sealing and holding said semiconductor light-emitting element and said optical element in the predetermined positional relationship, said resin being transparent to light emitted from said light-emitting element wherein said resin seals said semiconductor light-emitting element and said optical element in such a manner that said second surface of said optical element is not covered by said resin and the light emitted from said light-emitting element travels to said first surface along an optical path located entirely within said resin.

2. A semiconductor light-emitting device according to Claim 1 including at least a second optical element in the optical path extending in said resin between said semiconductor light-emitting element and said first surface of said optical element.

3. A semiconductor light-emitting device according to claim 1 wherein said resin is a cyclic aliphatic expoxy resin.

4. A semiconductor light-emitting device according to claim 2 wherein said resin is a cylcic aliphatic expoxy resin.

5. A semiconuctor light-emitting device according to claim 1 wherein said resin is diglycidyl ester.

6. A semiconductor light-emitting device according to claim 2 wherein said resin is diglycidyl ester.

7. A semiconductor light-emitting element according to claim 2 wherein said second optical element is selected from the group consisting of a beam splitter, an optical fiber, a lens, and a glass plate.

* * * * *